United States Patent [19]

Foust et al.

[11] Patent Number: 4,842,946
[45] Date of Patent: Jun. 27, 1989

[54] METHOD FOR TREATING A POLYIMIDE SURFACE TO IMPROVE THE ADHESION OF METAL DEPOSITED THEREON, AND ARTICLES PRODUCED THEREBY

[75] Inventors: Donald F. Foust, Scotia; William V. Dumas, Delanson; Edward J. Lamby, Scotia; Bradley R. Karas, Amsterdam, all of N.Y.

[73] Assignee: General Electric Company, Schenectady, N.Y.

[21] Appl. No.: 103,618

[22] Filed: Sep. 28, 1987

[51] Int. Cl.$^4$ .......................... C23C 18/20; C25D 5/56
[52] U.S. Cl. ...................................... 428/458; 204/20; 204/30; 427/304; 427/306; 427/307; 428/474.4
[58] Field of Search .......................... 204/20, 30, 38.4; 427/306, 307, 304; 428/458, 474.4

[56] References Cited

U.S. PATENT DOCUMENTS

| | | | |
|---|---|---|---|
| 3,954,570 | 5/1976 | Shirk et al. | 204/15 |
| 4,517,254 | 5/1985 | Grapentin et al. | 428/626 |
| 4,565,606 | 1/1986 | Cassat | 204/20 |

FOREIGN PATENT DOCUMENTS 3328765  2/1985  Denmark .

OTHER PUBLICATIONS

*IBM Technical Disclosure Bulletin*, Sep. 1986, vol. 29, No. 4, p. 1708.
*Chemical and Engineering News*, "Functional Groups Put On Polymer Surfaces", Sep. 22, 1986, pp. 27–28.

*Primary Examiner*—John F. Niebling
*Assistant Examiner*—William T. Leader
*Attorney, Agent, or Firm*—Mary Ann Montebello; James C. Davis, Jr.; William H. Pittman

[57] ABSTRACT

A method for treating a polyimide surface is disclosed, in which an adhesion-promoting compound such as thiourea contacts the surface prior to the electroless plating of metal thereon. Articles formed by such a method are also disclosed.

20 Claims, No Drawings

METHOD FOR TREATING A POLYIMIDE SURFACE TO IMPROVE THE ADHESION OF METAL DEPOSITED THEREON, AND ARTICLES PRODUCED THEREBY

BACKGROUND OF THE INVENTION

This invention relates to a method of improving the adhesion of metal applied on the surface of a polyimide, and to articles formed by such a method.

Printed circuit boards typically consist of a sheet of a dielectric, i.e., a nonconductive substrate formed from various filled or unfilled synthetic materials such a phenolics, glass-impregnated epoxies, and the like. The substrate is provided with a pattern of thin metal foil which function as a conductive path on one or both sides. The conductive paths or "traces" are usually formed of a conductive material such as copper, palladium, nickel, gold, and the like. These traces collectively define all of the electrical connections between components on the board, and are routed between appropriate locations on the board.

Plastics such as polyimides are particularly suitable as materials for printed circuit board substrates because of their strength, heat resistance, dimensional stability, and easy moldability. However, metallization does not adhere well to a polyimide surface. The printed circuit, i.e., the plated metal conductive path, can be damaged or separated from the substrate during subsequent manufacturing steps or during use of the circuit board.

Several attempts have been made to increase the adhesion of the conductive metal traces to the polyimide substrates. Adhesion is generally measured as "peel strength", i.e., the force, under controlled conditions, required to peel the metal from the substrate surface. Various surface treatment techniques are often used to physically modify the as-molded polyimide surface and thereby improve the adhesion of metal subsequently applied thereto. For example, polyimide surfaces have been gritblasted to provide a roughened surface which anchors the subsequently-applied metals. Chemical swelling agents or penetrants have been used to swell the surface, and chemical etching agents have been used to remove portions of the surface.

While such methods do increase the adhesion, they are often not entirely satisfactory for several reasons. Such techniques result in degradation of the molecules forming the polyimide surface, and may decrease both the tensile and impact sterngth of the substrate due to swelling and cracking of the entire substrate material, especially in those instances in which the polyimide contains fillers. Grit blasting requires cumbersome equipment and impedes the processing of printed circuit boards.

Another method for increasing adhesion is described in the application of Dumas et al., Serial No. 947,116, filed Dec. 29, 1986, now U.S. Pat. No. 4,775,449, and assigned to the assignee of the present invention. That application teaches the treatment of polyimides with compounds containing the

group in order to improve the adhesion of metals subsequently applied thereto.

The primary object of the present invention is to provide a process for improving the adhesion of metal to a polyimide surface without substantial physical modification or degradation of the surface structure.

An additional object of this invention is to provide a photopatternable polyimide surface to which a highly adherent metal layer may be electrolessly applied.

DETAILED DESCRIPTION OF THE INVENTION

Improved adhesion of a metallization layer on the surface of a polyimide substrate is achieved by treatment of the surface with an adhesion promoter, followed by electroless deposition of the metallization layer on the treated surface, and then heating of the resulting metallized article.

The polyimide materials forming the substrate may be any of those well-known in the art, such as those described in the *Kirk-Othmer Encyclopedia of Chemical Technology*, Third Edition, Vol. 18. Polyimides may be produced by a variety of methods, e.g., by reacting carboxylic acid anhydrides with aromatic diamines. Especially preferred polyimides for the present invention are those commonly referred to as "polyetherimides"- for example, those formed by the reaction of bisphenol A dianhydrides (BPADA) with phenylene diamine. Examples of polyetherimides and methods for their preparation are described in U.S. Pat. Nos. 3,983,093 and 4,360,633, issued to Williams, III et al. and Bolon et al., respectively. Both of these patents are incorporated herein by reference.

The polyimides may contain therein various amounts of fillers or reinforcing agents, all of which are well-known in the art. Illustrative fillers and reinforcing agents are disclosed in the examples and in U.S. Pat. No. 4,525,508, incorporated herein by reference. These materials include talcs, mica, aluminum silicates (clay), zinc oxide, calcium metaphosphate, titanium dioxide, carbon black, franklinite, precipitated or natural calcium carbonate, glass fibers, glass spheres, silicone-polyimide copolymeric materials, carbon fibers, and the like, as well as mixtures thereof.

The process of the present invention is also useful for polyimides which contain various other additives, such as pigments, ultraviolet radiation absorbing agents, impact modifiers, plasticizers, antioxidants, stabilizers, processing aids, antistatic agents, and the like.

The substrate of the present invention may be in a variety of shapes and sizes. For example, the substrate may be a printed circuit board having flat or curved surfaces as well as contact holes and vias.

The term "adhesion promoter" as used herein means an adhesion-promoting organic double bond-containing compound characterized by the presence of a carbonyl

or thiocarbonyl

group and at least one other atom that has at least one pair of free electrons. When applied to a polyimide surface, the adhesion promoter substantially increases the peel strength, i.e., the adhesion strength, of an electrolessly deposited layer of metal as measured by standard adhesion tests, for example, a test measuring the force required to lift metal strips from a plastic surface.

The adhesion promoter of the present invention is selected from the group consisting of

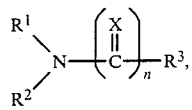   I

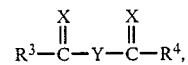   II

   III

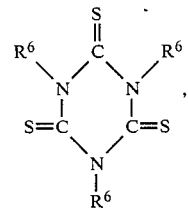   IV

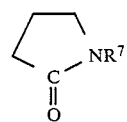   V and salts or hydrates thereof;

wherein each X is independently oxygen or sulfur;

$R^1$ and $R^2$ are independently selected from the group consisting of hydrogen, alkyl groups containing about 1 to about 15 carbon atoms, aromatic groups containing about 6 to about 20 atoms, and alkoxy groups containing about 1 to about 10 carbon atoms;

$R^3$ and $R^4$ are independently selected from the group consisting of $R^1$, $S^-$, $NH_2$, $NHR^1$, $NHNH_2$, and $R^1CO-$;

$R^5$ is selected from the group consisting of $R^1$, $NHR^1$, and $S^-$;

$R^6$ and $R^7$ are each independently hydrogen or an alkyl group containing about 1 to 10 carbon atoms;

Y is selected from the group consisting of NH, NHNH, $-S-S-$, alkylene groups containing from 1 to about 10 carbon atoms, and arylene groups containing about 1 to about 20 carbon atoms; and n is 1 to 2.

In preferred embodiments, $R^1$ and $R^2$ are independently selected from the group consisting of hydrogen, lower alkyl groups, lower alkoxy groups, and benzene. A preferred group of these compounds is characterized by $R^3$ and $R^4$ independently selected from the group consisting of lower alkyl groups, $NH_2$, $NHNH_2$, lower alkylamine groups and $CH_3CO-$; $R^5$ being $NHCH_3$ or $NHCH_2CH_3$; and $R^6$ and $R^7$ each independently being hydrogen or lower alkyl. "Lower" as used in this manner denotes 4 or less carbon atoms in the main chain of the group.

Various substituents, such as hydroxy or halogen groups, can be attached to the $R^1$-$R^7$ groups when appropriate.

Families of compounds suitable for use as adhesion promoters are the following:

ureas; dithiooxamides; acetamides; semicarbazides; dithiocarbamates; xanthates; and thiuramdisulfides.

Illustrative adhesion promoting compounds within the scope of the present invention include thiourea; N-methyl thiourea; 1,3-diphenyl-2-thiourea; acetyl thiourea; 1,3-dimethylurea; phenylurea; acetylurea; urea; 1,1,3,3-tetramethylurea; diacetamide; diethyl dithiocarbamic acid, sodium salt; formamide; N-methyl formamide; N,N-dimethyl formamide; thiosemicarbazide hydrochloride; 2,4-dithiobiuret; semicarbazide hydrochloride; acetamide; N,N-dimethylacetamide; thioacetamide; malonamide; N-methyl acetamide; dithiobiurea; tetramethyl thiuram disulfide; biuret; semicarbazide; oxamide; oxanilide; urethane; O-ethyl xanthanic acid, potassium salt; sodium thiocarbonate; dimethyl carbamic acid, sodium salt; diethylcarbamic acid, sodium salt; 3-(thiocarbamoyl) dithio carbazic acid, potassium salt; pyrrolidone; thiocyanuric acid; and alkyl dithiooxamides such as dimethyldithiooxamide and didodecyldithiooxamide A preferred group of adhesion promoters are thiosemicarbazide hydrochloride, 2,4-dithiobiuret, semicarbazide hydrochloride, acetylthiourea, thiourea, acetamide, urea, N,N-dimethylacetamide, thioacetamide, and thiocyanuric acid.

The most preferred adhesion promoter is thiourea, which significantly improves the adhesion of metal to the surfaces of various polyimides when used in accordance with the procedures described below.

The active ingredient of the present invention, i.e., the adhesion-promoting compounds such as those described above, may be applied to the polyimide surface by a variety of techniques. For example, the adhesion-promoting compound can be applied directly to the surface or can be dissolved in or admixed with an aqueous or organic liquid and applied in the form of a solution or slurry. Some of the adhesion-promoting compounds, such as diethyldithiocarbamic acid, can be used in the form of a salt or hydrate.

In one embodiment of the present invention, the adhesion-promoting compound may be incorporated into a non-aggressive solvent. As used herein, "incorporation" of the adhesion-promoting compounds implies dissolving a solid adhesion-promoting compound in one or more solvents, or admixing a liquid adhesion-promoting compound with one or more liquids.

Liquids which may be used in the present invention are those in which the adhesion-promoting compound or one of its salts or hydrates is stable and has sufficient solubility to produce an effective amount of the adhesion promoter in solution. An "effective amount" of adhesion-promoting compound means an amount sufficient to improve the adhesion of a metal layer applied to the polyimide surface as measured by the testing apparatus discussed below, as compared to an untreated surface.

The liquid must also be non-aggressive to the polyimide of which the substrate is formed. A non-aggressive liquid as defined herein is one which will not discolor, weaken, or cause other deleterious effects to the bulk of the polyimide substrate under conditions of use, i.e., when the substrate is immersed in the liquid system for a period of up to about 60 minutes. The bulk of the substrate as used herein is the region of the substrate which is about 15 microns or greater below the surface being plated by the various embodiments of the present invention.

Among the suitable liquids for the adhesion promoter are water and alcohols such as methanol, ethanol, phenol, cyclohexanol, and ethylene glycol, with water being preferred. Mixtures of alcohols with water or with other organic compounds are also suitable. Illustrative mixtures are those of methanol and pyridine; water and N-methyl-2-pyrrolidone; methanol and methylene chloride; and methanol and dimethylformamide (DMF). Other suitable liquid systems include mixtures of water with various acids such as hydrochloric acid, nitric acid, sulfuric acid, and the like.

The concentration of the adhesion-promoting compound in any of the liquids or liquid mixtures discussed above depends on the particular compound used, and typically ranges from about 0.1% by weight to about 50% by weight, based on total weight of the solution. The upper limit of the concentration is dependent on the saturation point of the compound in the solution. A preferred concentration range is from about 1% by weight to about 20% by weight. Higher concentrations within the above ranges are sometimes used when faster attainment of a particular level of adhesion is desired. Those skilled in the art are able to select an appropriate liquid for a particular adhesion promoter of the present invention without undue experimentation when the general guidelines disclosed herein are followed.

Due to good solubility, ready availability, ease of handling, and low cost, water is the preferred solvent when the adhesion promoter is thiourea. Thiourea is advantageously dissolved in water at about 1% by weight to about 20% by weight, and more preferably, at about 8% by weight to about 15% by weight.

The pH of the adhesion promoter solution is generally not critical to the present invention, and may range from about 0 to about 11.0. While a substantially neutral pH is preferred, i.e., between about 6.5 and 7.5, the solution is advantageously made acidic in certain instances by the addition of acid. For example, copper already present on the substrate prior to treatment according to the present invention may tarnish due to oxidation when subsequently exposed to treatment solutions having a pH of greater than about 4.5. In such an instance, it is desirable to maintain the solution containing the adhesion promoter at a pH less than about 4.5, and more preferably, less than 1.0. Addition of any of various acids such as citric, phosphoric, sulfuric or hydrochloric acid, etc., is suitable for this pH adjustment.

The temperature of the solution containing the adhesion promoter is preferably maintained at between about 65° C. and 85° C. during treatment of the polyimide surface, although improved adhesion can also be obtained at temperatures as low as room temperature. Those skilled in the art can easily determine the optimal temperature, based in part on the solubility characteristics of a particular adhesion promoter in a particular liquid or liquid mixture.

The liquid system containing the adhesion-promoting compound may be applied to the surface of the polyimide substrate by any art-recognized technique, e.g., spraying or brushing. In preferred embodiments, the substrate is immersed in the organic or aqueous solution for a preselected period of time. The immersion or treatment will depend on several factors, including the particular adhesion promotor used, its concentration in the solution, the type of aqueous or organic liquid employed, as well as the particular polyimide material present. The appropriate time for treatment may be readily determined without undue experimentation by those skilled in the art. Typically, the treatment time ranges from about 5 minutes to about 15 minutes.

Another factor influencing the exposure time is the presence or absence of filler materials in the polyimide. For example, inorganic filler material near or protruding from the polyimide surface may affect the adhesion of subsequently applied metal layers, and may therefore alter the time necessary for treatment with the adhesion promoter to achieve a desired level of adhesion. Those skilled in the art can readily determine the effective treatment time for a particular filled polyimide, based on trial adhesion values.

In preferred embodiments, especially when the polyimide contains a filler such as those described above, the polyimide surface can be prepared by a pretreatment prior to treatment with the adhesion-promoting compound. The pretreatment often further improves the adherence of metals subsequently applied to the polyimide surface. After the surface has been cleaned by well-known methods, e.g., the use of a degreasing compound such as 1,1,2-trichlorotrifluoroethane, the pretreatment comprises first treating the surface with a mild etching compound, e.g., a solvent which is capable of mildly etching the polyimide. Examples of mild etching compounds suitable for use on a polyimide surface include concentrated sulfuric acid, dimethylformamide, N-methyl-2-pyrrolidone, pyridine, tetrahydrofuran, and methylene chloride. Although these compounds remove a layer of the polyimide surface as described below, they are considered mildly etching and nonaggressive because, when used according to the procedures described herein, they do not swell or crack the bulk of the polyimide substrate, as often occurs when swell and etch techniques of the prior art are employed. The mild etching compound may be applied by well-known methods, e.g., brushing, spraying, immersion and the like, and in preferred embodiments, is followed by one or more rinsing steps with water, methanol or other alcohols.

Treatment with the mild etching compound may be carried out for about 15 seconds to about 5 minutes, but is preferably carried out for less than 1 minute.

After the mild etching compound has been applied, a residual film of varying thickness is present on the polyimide surface. The film remains on the surface even after rinsing. The film may be loosened from the surface by treatment with a basic solution by one of the methods described above for about 30 seconds to about 10 minutes. Suitable basic solutions include those formed by dissolving 0.1M to about 10M of a compound such as sodium hydroxide, potassium hydroxide, tetramethylammonium hydroxide, and mixtures thereof in a solvent such as water, methanol, ethanol, ethylene glycol, and mixtures thereof. Those skilled in the art will be able to select a particular solvent, solute, and solute concentration without undue experimentation.

After treatment with the basic solution and rinsing of the surface again, the loosened residue may be removed by treatment with a solution comprising a mild etching compound (as described above) and either an alcohol, water, or mixtures thereof. The mild etching compound should be one which will not react with the water and/or alcohol. For example, sulfuric acid and methanol react with one another and thus would not be a suitable combination for this step. Methanol is the preferred alcohol in this solution because of its ability to quickly remove the loosened residue. The solution ingredients and their respective proportions depend in part on the particular polyimide employed and on the amount of residual film present on the polyimide surface, and may be readily determined by those skilled in the art. Typically, the volume ratio of the water/alcohol component to the mild etching compound ranges from about 20:80 to 80:20, with 50:50 being preferred. Treatment duration for this step ranges from about 60 seconds to about 20 minutes. Furthermore, treatment of the polyimide with the adhesion-promoting compound discussed above may be combined with this pretreatment step by incorporating the adhesion promoter into the solution comprising the water/alcohol component and the mild etching compound.

Although the specific mechanism is not completely understood, it is thought that the pretreatment further enhances adhesion of filled polyimides by removing impurities from the surface and by removing a surface layer, i.e., the residual film, which contains only polyimide, to expose an underlying surface containing both polyimide and filler. Furthermore, the effect of the mild etching compound and the presence of intermittent protrusions of filler material on the newly exposed surface apparently allows the subsequently applied metal to become anchored securely to the "roughened" surface.

The pretreatment of the polyimide surface may also be performed when the polyimide does not contain a filler, but is especially beneficial for enhancing adhesion in those instances in which the polyimide surface does contain a filler.

The solution containing the adhesion promoter may be prepared shortly before treatment of the polyimide surface. Alternatively, the solution may be prepared up to about several months prior to use in the present invention.

The specific chemical mechanism by which the adhesion promoter enhances adhesion of metal subsequently applied to a polyimide substrate is not fully understood. It is thought that the adhesion promoter in part functions as a chelating agent because of the presence of polydentate ligands which can wrap around and complex the metal which is subsequently applied to the polyimide surface. While treatment of the polyimide with the adhesion promoter may involve some chemical alteration of the polyimide, such treatment does not degrade or weaken the bulk of the substrate, unlike swell and etch treatments of the prior art.

After treatment of the polyimide surface by exposure to the adhesion-promoting compound, the substrate may be thoroughly rinsed with water or with an alcohol solution, and then activated for plating by methods well-known in the art and described, for example, in U.S. Pat. No. 3,589,916. For example, the substrate may be contacted with an acid solution of a precious metal, such as palladium chloride in hydrochloric acid, for a period of time sufficient to cause catalytic activation of the substrate. Typical activation and plating processes suitable for the present invention are also described in Attorney Docket No. RD-16219, W.T. Grubb et al., Serial No. 944,728, filed Dec. 22, 1986, and in Attorney Docket No. RD-16559, W. Dumas et al., Serial No. 947,116, filed Dec. 29, 1986, now U.S. Pat. No. 4,775,449, both of which are assigned to the assignee of the present invention, and incorporated herein by reference.

It is often useful to begin the activation of the substrate by treatment with an additive which aids in absorption of the plating catalyst. Such additives are well-known in the art. Exemplary aids to catalyst absorption include Shipley 1175A, a product of the Shipley Company, and Metex 9420, a product of the MacDermid Corporation. Immersion in about 0.1% to about 5% by volume of either of these agents in water for about 1 minute to about 10 minutes at a temperature of from about 40° C. to 80° C. is generally sufficient. Although such a treatment is not deemed critical to the present invention, its use often enhances the uniform deposition of electrolessly-applied metals onto the substrate.

After the substrate has been water-rinsed, activation for plating may be accomplished by methods which are well-known in the art and described, for example, in U.S. Pat. No. 3,589,916. For example, the substrate may be contacted with an acid solution of a precious metal, such as palladium chloride in hydrochloric acid, for a period of sufficient to cause catalytic activation of the substrate. Exemplary processes are also described in the W. T. Grubb et al. application mentioned above.

Another suitable activation system involves the use of collodial suspensions of precious metals, as taught in U.S. Pat. Nos. 3,011,920 and 3,841,881, issued to Shipley and Feldstein et al., respectively, both of which are incorporated herein by reference. For example, these substrates may be immersed in a solution of Shipley Cataprep ® 404, a product of the Shipley Company. This solution provides a protecting agent for the plating catalyst subsequently applied, and comprises sodium bisulfate and various surfactants. The substrates may then be immersed in a solution of Shipley Cataposit ® 44, which contains the Cataprep ® 404 ingredients and also tin and palladium, the electroless plating catalyst. After a water rinse, the substrates may then be immersed in a solution of Shipley Cuposit ® Accelerator 19, a fluoroboric acid-containing formulation used to separate tin from the plating catalyst.

After another water rinse, electroless plating can be undertaken. Illustrative metals used to form the metallization layer include copper, palladium, nickel, and gold. Electroless baths are well-known in the art and are generally described in the *Kirk-Othmer Encyclopedia of Chemical Technology*, 3rd Edition, Volume 8, the contents of which are incorporated herein by reference. The selection of a particular bath or electroless plating process is not critical to the present invention. The contents of the bath and the particular plating parameters, e.g., temperature, pH, and immersion time, will of course depend on the particular polyimide serving as the substrate, and also upon the particular metal being deposited thereon. One suitable plating bath is the Shipley Cuposit ® 250 system. Another suitable bath is the Enthone 406 system. Furthermore, the Grubb et al. and Dumas et al. applications mentioned above list suitable electroless plating formulations. Immersion times, bath temperatures, and other operating parameters can be determined and controlled according to manufacturers' suggestions. Those having ordinary skill in the plating arts will be able to determine the most appropriate plating regimen for a particular situation. The electrolessly-applied metallization layer usually has a thickness of about 0.01 mil to about 0.1 mil.

The polyimide surface is heated after electroless deposition of the metal. Oven heating of the entire article, i.e., substrate with metal thereon, is sufficient, athough any heating method is suitable. Typically, this heat treatment is carried out at a temperature ranging from about 60° C. to about 170° C. for about 5 minutes to about 120 minutes, with higher temperatures within the above range generally compensating for shorter duration, and vice versa. Although the mechanism is not understood, the heat treatment appears to reduce the time required to attain optimal adhesion.

If another layer of metal is to be applied on the surface, e.g., by electroplating, the above-described heat treatment can in some instances be omitted if a heat treatment is employed after the plating of more of the metal, as described below. However, preferred embodiments include the heat treatment prior to this deposition of more of the metal. Most preferred embodiments include a heat treatment prior to the deposition of more of the metal (i.e., after the electroless deposition), along with another heat treatment after deposition of more of the metal, as described below.

Electroplating is the preferred application method for the second metal layer. The substrate is usually cleaned prior to immersion in the electroplating bath. Such baths are well-known in the art and are described, for example, in U.S. Pat. No. 4,555,315, incorporated herein by reference, although the particular electroplating bath used is not critical to the present invention. Furthermore, those skilled in the art appreciate that the particular bath contents will depend upon some of the factors considered for the electroless deposition of metal described above. Typically, the electroplating bath is operated at a temperature ranging from about 16° C. to about 38° C., with a cathode current density in the range of about 1 ASF to about 80 ASF. A description of such baths is given in the Kirk-Othmer reference described above, in Vol. 8, beginning on page 826. When such a bath is used to apply a layer of copper to the electroless-applied layer, it typically includes an aqueous acidic copper electrolyte such as those of the acidic copper sulfate or acidic copper fluoroborate type; halide ions, such as chloride and/or bromide ions; and various other components well-known in the art. The thickness of this second metal layer will of course depend upon the particular end use of the metal-coated substrate. Typically, thicknesses range from about 1 mil to about 5 mils. A variation in thickness within this range does not appear to affect the adhesive strength of the metal to the underlying electroless layer and to the substrate.

After the second metal layer has been applied to the first layer of metal on the substrate, the composite article can be heat-treated for about 15 minutes to about 48 hours at a temperature of from about 25° C. to about 170° C. Higher temperatures within the above range generally compensate for shorter duration, and vice versa. An especially preferred heat treatment is from about 75° C. to about 130° C. for about 1 hour to about 16 hours. This heat treatment reduces the time required to produce optimal adhesion, especially when used in conjunction with a heat treatment prior to application of this second metal layer, as described above.

When it is desired that the metal applied to a polyimide substrate be in the form of a pattern rather than a continuous layer, the substrate surface, having been pretreated with the adhesion-promoting compound, may then be patterned by well-known methods, as described, for example, in U.S. Pat. No. 3,562,005 issued to DeAngelo et al., and incorporated herein by reference. Another patterning technique suitable for use herein is disclosed in the copending Grubb et al. application discussed above. This resistless technique involves the photopatterning of an organic substrate by first exposing the substrate to electromagnetic radiation, followed by treatment with a precious metal compound to activate the surface. The metallic pathway formed after plating of the activated surface will tightly adhere to the underlying polyimide substrate because of the adhesion-promoting treatment of the present invention.

In those instances in which even greater adhesive strength between the metal pattern and the underlying polyimide substrate is desired, the substrate may be abraded prior to treatment with the adhesion promoting compound. Well-known abrasion methods, e.g., grit blasting, are suitable for the method of the present invention. The combined effects from abrading the substrate and then treating the substrate with the adhesion-promoting compound may result in even greater adhesive strength than when the abrasion step is omitted. Furthermore, the abrading step may also be used in conjunction with the pretreatment step described above. However, since the abrasion step may alter the appearance of certain polyimides, its effect on the physical appearance of the particular polyimide employed should be determined beforehand.

As is apparent from above, the present invention includes within its scope a polyimide substrate (optionally, pretreated) treated with an adhesion promoter as described above, and then electrolessly plated with a metal such as copper. The article is generally characterized by an adhesive strength of at least about 5.0 pounds/inch, as measured by the technique described below. Furthermore, another metal layer may be disposed on top of the electrolessly-deposited layer.

The following specific examples provide novel embodiments of the present invention. They are intended for illustrative purposes only and should not be construed as a limitation upon the broadest aspects of the invention. All liquid ratios are by volume, unless otherwise indicated.

In these examples, adhesion of the metal to the substrate was evaluated by measuring the force necessary to peel strips of the metal from the substrate surface. In the test, the metal surface of each plated sample is etched into 1/8 inch strips. An end of each strip is clipped to an Ametek digital force measuring gauge which is connected to a computer processor. Force values required to lift the metal strips from the substrate are converted by the computer into pounds per inch peel values. Multiple peel values for each strip are obtained and then averaged.

EXAMPLE 1

Samples 1–19 were substrates formed from a polyetherimide material having 30% by weight milled glass dispersed therein. Unless otherwise indicated, each sample was treated according to the following regimen:

| Step | Procedure[a] | Time (minutes) |
| --- | --- | --- |
| A | 1,1,2-trichlorotrifluoroethane | 2 |
| B | Dry the substrate | — |
| C | Concentrated sulfuric acid | 0.5 |
| D | Rinse in water | 2 |
| E | Methanol | 1 |
| F | Potassium hydroxide in methanol (2M) | 5 |
| G | Methanol | 2 |

-continued

| Step | Procedure[a] | Time (minutes) |
|---|---|---|
| H | Dimethylformamide in methanol (1/1) | 2 |
| I | Rinse in water | 2 |
| J | Treatment with adhesion-promoter[b], 75° C. | 10 |
| K | Rinse with water | 2 |
| L | Immersion in Shipley Cleaner/Conditioner 1175A | 5 |
| M | Rinse in water | 2 |
| N | Shipley Cataposit ® 404 | 1 |
| O | Shipley Cataposit ® 44, 44° C. | 3 |
| P | Rinse in water | 2 |
| Q | Shipley Accelerator 19 | 3 |
| R | Rinse in water | 2 |
| S | Shipley Cuposit ® 250, 48° C. | 30 |
| T | Rinse in water | 2 |
| U | Dry the substrate | — |
| V | Heat treatment at 110° C. | 120 |
| W | Plating in copper electroplating bath[c] | 60 |
| X | Dry the substrate | — |
| Y | Heat treatment at 110° C. | 16 hours |

[a]Substrates were immersed in the liquid components.
[b]Adhesion promoting compounds for step J are listed in Table 1. Concentration of each was 10% by weight in water.
[c]125 g/L $CuSO_4 \cdot 5H_2O$; 60 g/L $H_2SO_4$; 50 ppm chloride; plating at 36 ASF to 1.4 mil total thickness.

Samples 16–19 served as controls. Sample 16 was subject to the steps listed above but was not treated with an adhesion promoter in step J. Samples 17–19 were treated in step J with compounds outside the scope of the present invention.

After being cooled to room temperature, the samples were tested for adhesion by the method described above. The results are shown in Table 1.

TABLE 1

Adhesion Results

| Sample No. | Adhesion promoting compound | Adhesion value average (lbs/in) |
|---|---|---|
| 1 | diacetamide | 7.3 |
| 2 | 1,1,3,3-tetramethylurea | 7.6 |
| 3 | diethyldithiocarbamic acid, sodium salt | 7.7 |
| 4 | formamide | 8.0 |
| 5 | pyrrolidone | 8.1 |
| 6 | thiosemicarbazide hydrochloride | 8.8 |
| 7 | 2,4-dithiobiuret | 8.9 |
| 8 | semicarbazide hydrochloride | 9.0 |
| 9 | acetylthiourea | 9.1 |
| 10 | thiourea | 9.3 |
| 11 | acetamide | 9.8 |
| 12 | urea | 9.9 |
| 13 | N,N—dimethylacetamide | 9.9 |
| 14 | thioacetamide | 10.1 |
| 15 | thiocyanuric acid | 10.6 |
| 16 | NONE | 6.4 |
| 17 | n-butyl amine | 1.0 |
| 18 | methyl ethyl ketone | 5.1 |
| 19 | sodium sulfide | 5.3 |

The above results demonstrate that treatment of polyimides with the adhesion-promoting compounds of the present invention improves adhesion, as compared to samples without any treatment, or those treated with compounds outside the scope of the present invention.

EXAMPLE 2

Samples of polyetherimide filled with various materials were treated according to the steps listed in Example 1. The adhesion promoting compound was thiourea at 10% by weight in water. Filler concentrations are given in weight percent. The results are listed in Table 2:

TABLE 2

Treatment with Adhesion Promoter on Filled and Unfilled Samples

| Sample No. | Filler Material | Adhesion value average (lbs/in) |
|---|---|---|
| 20 | NONE | 11.3 |
| 21 | 20% glass | 12.3 |
| 22 | 30% glass | 10.6 |
| 23 | 15% Siltem ® | 9.7 |
| 24 | 30% franklin fibers | 10.7 |
| 25 | 30% glass/15% $TiO_2$ | 8.0 |
| 26 | 20% mica | 6.8 |
| 27 | 30% calcium metaphosphate fibers | 5.2 |
| 28 | 30% glass, 1.5% carbon black | 10.5 |

EXAMPLE 3

Samples of polyetherimide filled with 30% by weight glass fibers were treated as in Example 1, except that the sulfuric acid treatment time for step C was varied. The adhesion promoter employed was thiourea, in water at 10% by weight. Average peel strengths for the various samples are listed in Table 3.

TABLE 3

Variation in Sulfuric Acid Treatment Time

| Sample No. | $H_2SO_4$ Treatment Time | Adhesion value average (lbs/in) |
|---|---|---|
| 29 | 15 sec. | 11.4 |
| 30 | 30 sec. | 12.0 |
| 31 | 1 min. | 13.0 |
| 32 | 3 min. | 13.6 |
| 33 | 5 min. | 17.6 |

The above results indicate that, in certain embodiments of this invention, an increase in the time of exposure to the mild etching solvent, $H_2SO_4$, results in an increase in adhesion.

It will be further understood that the foregoing examples are illustrative only, and that variations and modifications may be made without departing from the scope of this invention. For example, the various rinsing, drying and cleaning steps set forth in the above examples may be adjusted and sometimes omitted by those skilled in the art, depending on the condition of the substrate and on the other process parameters discussed above.

What is claimed is:

1. A method for improving adhesion of a metallization layer on a polyimide surface which comprises the steps of: treatment of the surface with an adhesion-promoting organic double bond-containing compound selected from the group consisting of

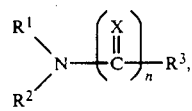

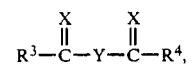

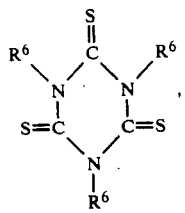

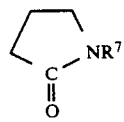

and salts or hydrates thereof;
wherein each X is independently oxygen or sulfur;
$R^1$ and $R^2$ independently selected from the group consisting of hydrogen, alkyl groups containing about 1 to about 15 carbon atoms, aromatic groups containing about 6 to about 20 atoms, and alkoxy groups containing about 1 to about 10 carbon atoms;
$R^3$ and $R^4$ are independently selected from the group consisting of $R^1$, $S-NH_2$, $NHR^1$, $NHNH_2$ and $R^1CO-$;
$R^5$ is selected from the group consisting of $R^1$, $NHR^1$, and $S^-$;
$R^6$ and $R^7$ are each independently hydrogen or an alkyl group containing about 1 to 10 carbon atoms;
Y is selected from the group consisting of NH, NHNH, $-S-S-$, alkylene groups containing from 1 to about 10 carbon atoms, and arylene groups containing about 1 to about 20 carbon atoms; and
n is 1 or 2;
electroless deposition of the metallization layer on the treated surface; and heating of the resulting metallized article.

2. The method of claim 1 wherein the metal of the metallization layer is copper.

3. The method of claim 1 wherein $R^1$ and $R^2$ are independently selected from the group consisting of hydrogen, lower alkyl groups, lower alkoxy groups, and benzene.

4. The method of claim 3 wherein $R^3$ and $R^4$ are independently selected from the group consisting of lower alkyl groups, $NH_2$, $NHNH_2$, lower alkylamine groups and $CH_3CO-$;
$R^5$ is $NHCH_3$ or $NHCH_2CH_3$; and
$R^6$ and $R^7$ are each independently hydrogen or a lower alkyl group.

5. The method of claim 4 wherein the adhesion-promoting compound is selected from the group consisting of thiosemicarbazide hydrochloride, 2,4-dithiobiuret, semicarbazide hydrochloride, acetylthiourea, thiourea, acetamide, urea, N,N-dimethylacetamide, thioacetamide, and thiocyanuric acid.

6. The method of claim 5 wherein the adhesion-promoting compound is thiourea.

7. The method of claim 1 wherein the adhesion-promoting compound is incorporated into a non-aggressive liquid at a concentration in the range of about 0.1% by weight to about 50% by weight.

8. The method of claim 7 wherein the liquid containing the adhesion promoter is maintained at a pH less than about 4.5.

9. The method of claim 7 wherein the liquid containing the adhesion promoter is maintained at a pH of about 6.5 to about 7.5.

10. The method of claim 7 wherein thiourea as the adhesion promoter is dissolved in water at about 1% by weight to about 20% by weight.

11. The method of claim 10 wherein the solution of water and thiourea is maintained at a temperature of about 65° C. to about 85° C. and a pH of about 0 to about 11.0 during treatment of the polyimide surface.

12. The method of claim 11 wherein the pH is less than about 4.5.

13. The method of claim 1 further comprising the step of preparing the polyimide surface for treatment with the adhesion-promoting organic compound by mild etching, washing with a basic solution, and then treatment with a composition consisting essentially of a mild etching compound and either an alcohol, water, or mixtures thereof.

14. The method of claim 13 wherein the mild etching compound is selected from the group consisting of concentrated sulfuric acid, dimethylformamide, and N-methyl-2-pyrrolidone; and the basic solution comprises a compound selected from the group consisting of sodium hydroxide, potassium hydroxide, tetramethylammonium hydroxide, and mixtures thereof, each of which may be dissolved in a solvent selected from the group consisting of water, methanol, ethanol, ethylene glycol, and mixtures thereof.

15. The method of claim 14 wherein the polyimide contains a filler.

16. The method of claim 1 wherein the polyimide surface having the metallization layer thereon is heat-treated at a temperature of from about 60° C. to about 170° C. for about 5 minutes to about 120 minutes prior to the deposition of more of the metal by electroplating.

17. The method of claim 16 wherein the polyimide surface is heat-treated after electroplating, at a temperature of from about 25° C. to about 170° C. for about 15 minutes to about 48 hours.

18. The method of claim 1 wherein the heating of the article is performed after the deposition of more of the metal by electroplating, at a temperature of from about 25° C. to about 170° C. for about 15 minutes to about 48 hours.

19. The article produced by treating a polyimide surface according to the method of claim 1, characterized by an adhesive strength of at least about 5.0 pounds per inch.

20. The article of claim 19 wherein the metal of the metallization layer is copper.

* * * * *